(12) United States Patent
Brechignac et al.

(10) Patent No.: US 6,312,975 B1
(45) Date of Patent: Nov. 6, 2001

(54) SEMICONDUCTOR PACKAGE AND METHOD OF MANUFACTURING THE SAME

(75) Inventors: Rémi Brechignac; Alexandre Castellane, both of Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/237,345

(22) Filed: Jan. 26, 1999

(30) Foreign Application Priority Data

Feb. 10, 1998 (FR) .................................................. 98 01549

(51) Int. Cl.[7] ........................... H01L 21/44; H01L 21/48; H01L 21/50; H01L 23/552
(52) U.S. Cl. ........................... 438/112; 257/659; 257/660
(58) Field of Search ............................. 438/112; 257/676, 257/696, 695, 659, 660

(56) References Cited

U.S. PATENT DOCUMENTS 5,270,488   12/1993   Ono et al. .
5,679,975   10/1997   Wyland et al. .

FOREIGN PATENT DOCUMENTS

| 58-122759 | 7/1983 | (JP) . |
|---|---|---|
| 59-022333 | 2/1984 | (JP) . |
| 59-051555 | 3/1984 | (JP) . |
| 3-053550 | 3/1991 | (JP) . |
| 4-147652 | 5/1992 | (JP) . |
| 4-278567 | 10/1992 | (JP) . |

*Primary Examiner*—Charles Bowers
*Assistant Examiner*—Nema Berezny
(74) *Attorney, Agent, or Firm*—Theodore E. Galanthay; Stephen C. Bongini; Fleit, Kain, Gibbons, Gutman & Bongini P.L.

(57) ABSTRACT

A semiconductor package having an encapsulation that encapsulates an integrated circuit chip and an external lead frame for the chip. Multiple connection leads project from the periphery of the encapsulation. At least one external face of the encapsulation is covered with a layer of electrically conductive material, and the conducting material layer has at least one lateral extension that electrically contacts at least one of the projecting connection leads. A method of manufacturing such a semiconductor package is also provided.

17 Claims, 3 Drawing Sheets

SEMICONDUCTOR PACKAGE AND METHOD OF MANUFACTURING THE SAME

CROSS-REFERENCE TO RELATED APPLICATIONS

This application is based upon and claims priority from prior French Patent Application No. 98-01549, filed Feb. 10, 1998, the entire disclosure of which is herein incorporated by reference.

BACKGROUND OF THE INVENTION

1. Field of the Invention

The present invention relates to semiconductor packages, and more specifically to a semiconductor package that provides optimum electrical characteristics.

2. Description of Related Art

Currently, a user requiring a high-performance semiconductor package must choose a package in which an integrated circuit chip and an external lead frame are assembled inside a ceramic case. While using a ceramic case allows optimum electrical characteristics to be obtained, the cost of ceramic case packages is higher than the cost of semiconductor packages in which the integrated circuit chip is encapsulated in an epoxy resin.

SUMMARY OF THE INVENTION

In view of these drawbacks, it is an object of the present invention to remove the above-mentioned drawbacks and to provide a low cost semiconductor package that provides characteristics similar to the characteristics of ceramic case-type semiconductor packages. The semiconductor package has an encapsulation that encapsulates an integrated circuit chip and an external lead frame for the chip. Multiple connection leads project from the periphery of the encapsulation. At least one external face of the encapsulation is covered with a layer of electrically conductive material, and the conducting material layer has at least one lateral extension that electrically contacts at least one of the projecting connection leads.

Another object of the present invention is to provide a method of manufacturing a low cost semiconductor package that provides characteristics similar to the characteristics of ceramic case-type semiconductor packages. A layer of electrically conductive material is deposited on at least one face of the encapsulation, and the conducting material layer has at least one lateral extension that electrically contacts at least one projecting connection lead. According to one preferred method, the package is placed in an opening of a mask in such a position that the opening matches the outline of the encapsulation. The wall of the opening has at least one recess that forms a well that emerges opposite at least one of the connection leads. The layer of electrically conductive material is deposited (e.g., by spraying or screen printing) in or through the opening. In further embodiments, an electrically conductive metal sheet is adhesively bonded to at least one face of the encapsulation. Preferably, the manufacturing method can be integrated into already existing assembly lines.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
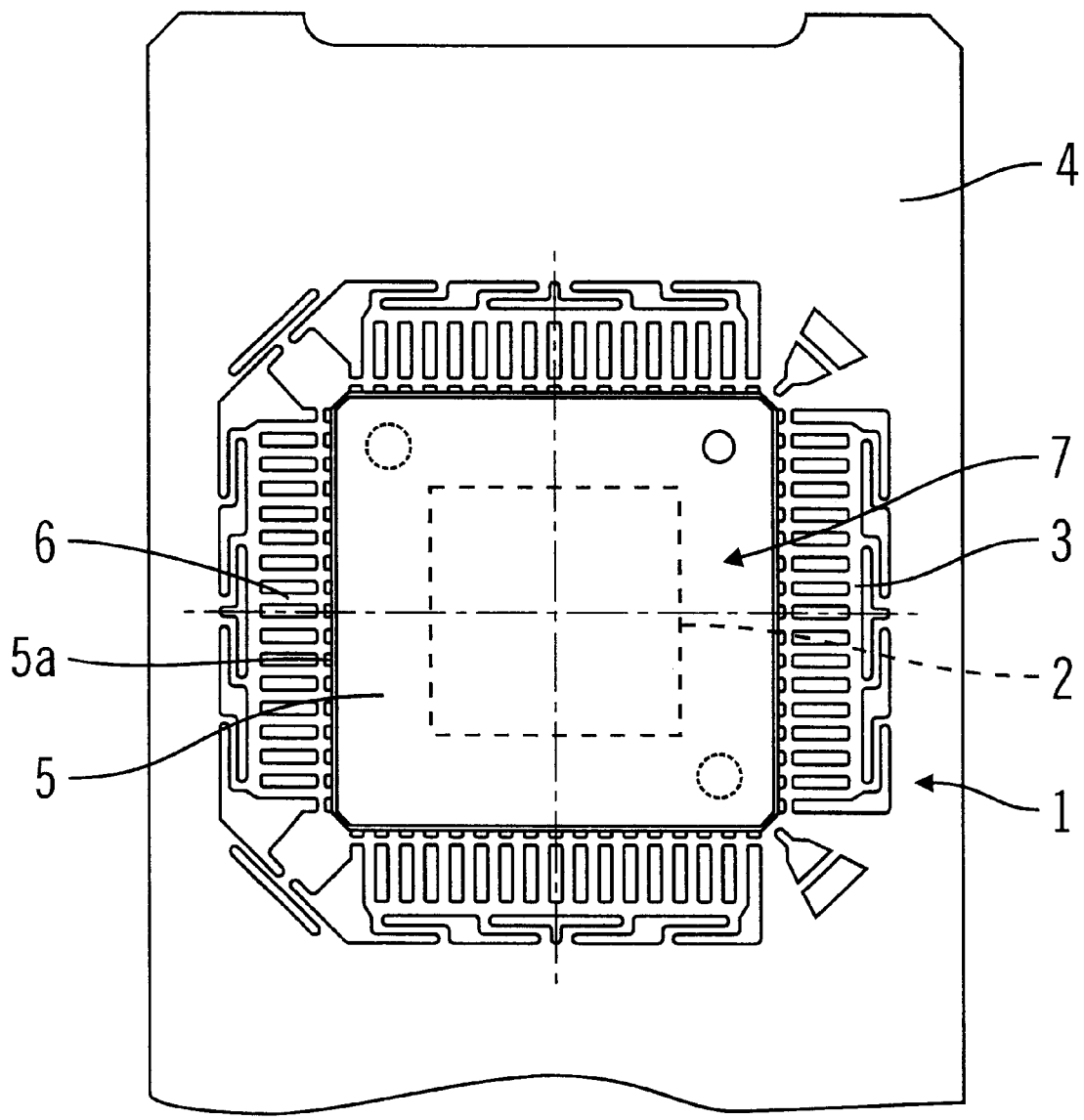
FIG. 1 shows a semiconductor device.

A semiconductor device formed through conventional manufacturing steps is shown in FIG. 1. The semiconductor device 1 includes an integrated circuit chip 2 and a lead frame 3 that is formed in a metal sheet 4. For example, the integrated circuit chip 2 can be produced by forming an operational circuit on a semiconductor substrate. An encapsulation 5 encapsulates the chip 2 and part of the lead frame 3 such that the lead frame 3 has multiple projecting connection leads 6 around the periphery of the encapsulation. The exemplary encapsulation 5 is generally of a parallelepipedal shape so as to form a semiconductor package 7 with side walls 5a having a taper angle with respect to the plane of the lead frame 3.

Figure 2:
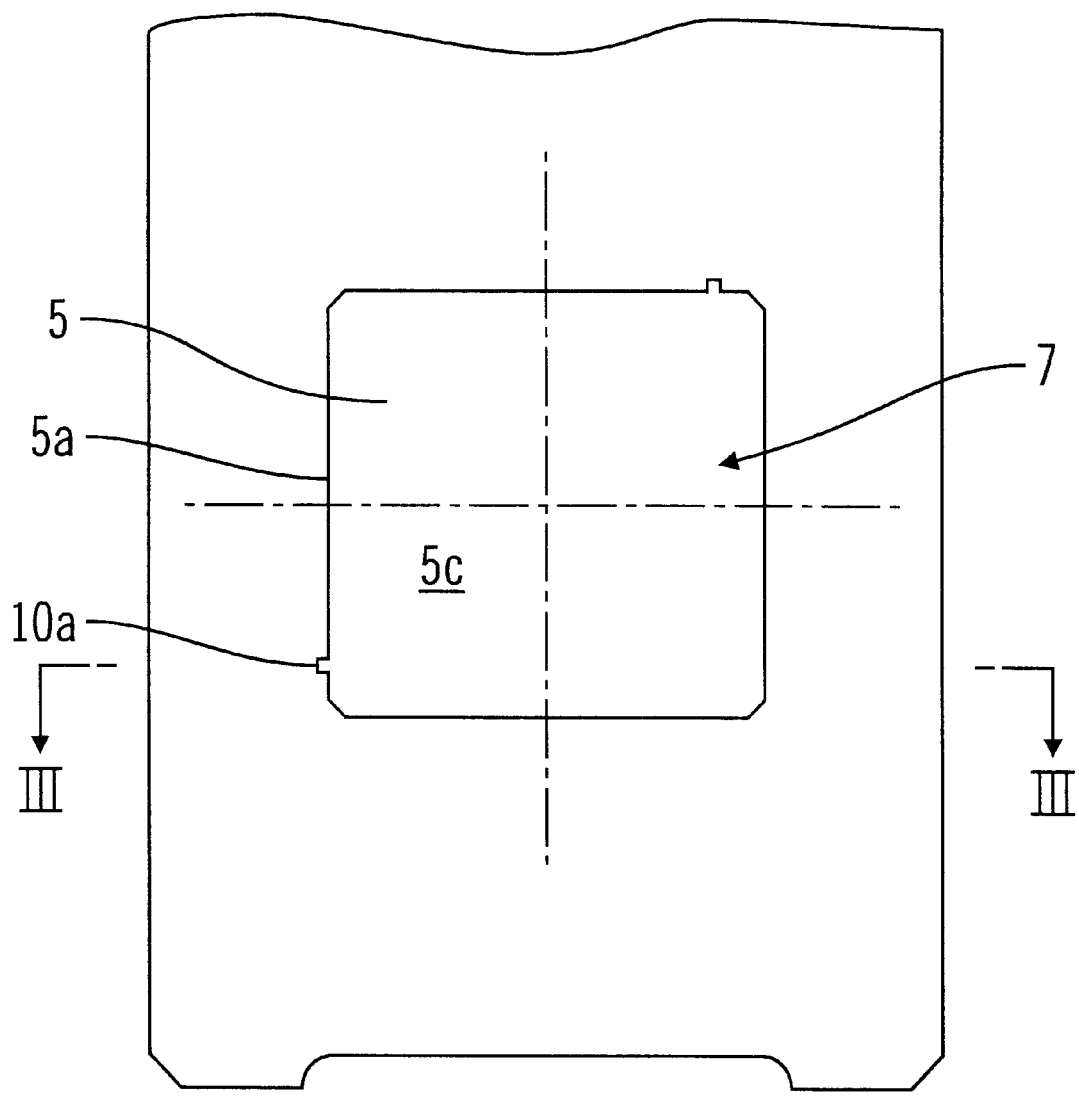
FIG. 2 shows a top view of a semiconductor package formed in accordance with an embodiment of the present invention.
Figure 3:
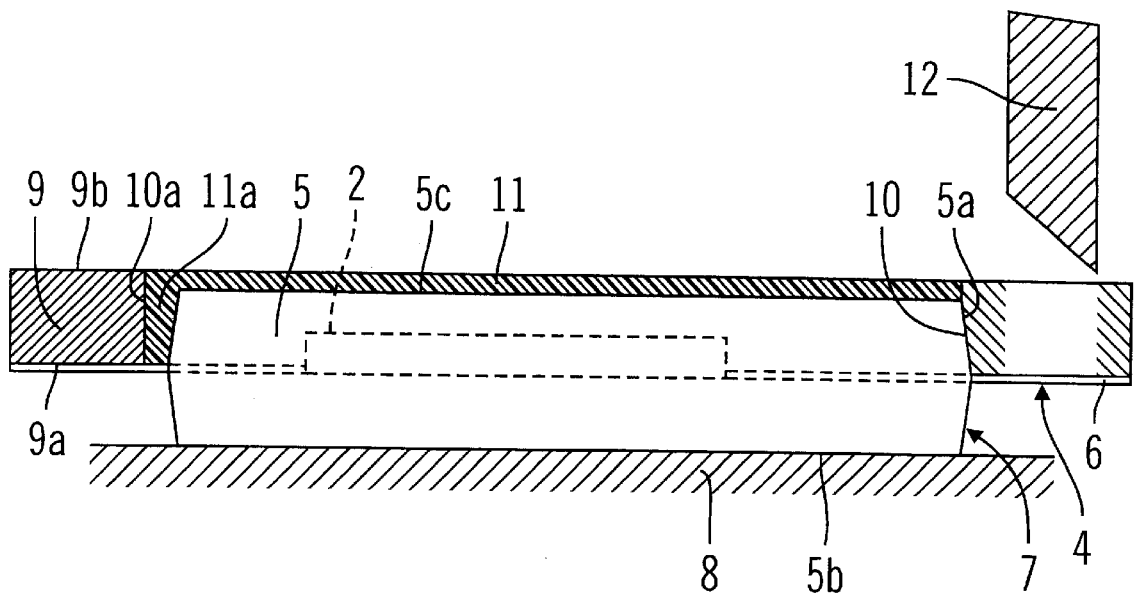
FIG. 3 shows a cross-sectional view of the semiconductor package taken along line III—III of FIG. 2.

FIGS. 2 and 3 show portions of a method of manufacturing a semiconductor package in accordance with an embodiment of the present invention. As shown, a semiconductor device (such as the one shown in FIG. 1) is placed on the table 8 of a screen printing machine such that a first external face 5b of the package 7 contacts the table. A flat mask 9 having an opening 10 is placed such that the opening 10 matches the outline of one of the side walls 5a of the package 7 and the lower face 9a of the mask comes into contact with one side of the connection leads 6 on one side of the lead frame 3. Further, the thickness of the mask 9 is such that the upper face 9b of the mask extends slightly above the level of a second external face 5c of the package 7.

Figure 4:
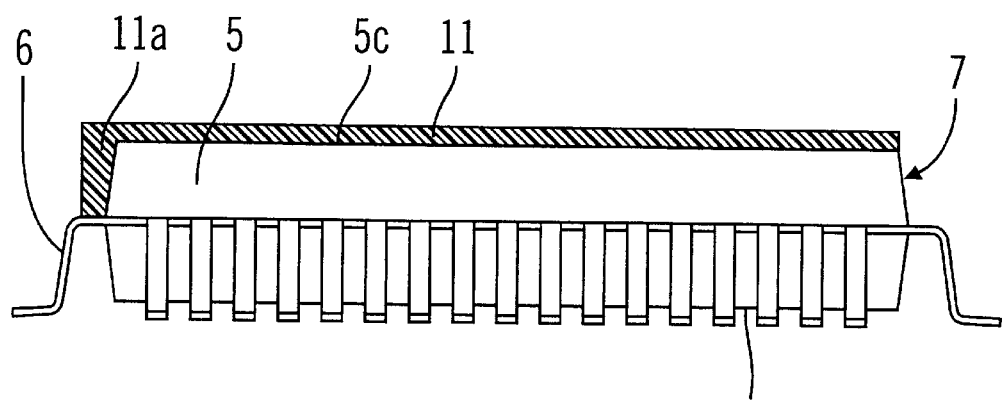
FIG. 4 shows a side view of the semiconductor package of FIG. 2.

A recess or vertical groove is made in the wall of the opening 10 in the mask 9 to determine a well 10a that emerges opposite one of the connection leads 6. Then, an electrically conductive material is deposited on the package 7. For example, the conductive material can be liquid or pasty and based on a silver or copper-filled epoxy resin. Next, a doctor 12 is passed over the upper face 9b of the mask 9 so as to extend the conductive material 11 over the second external face 5c of the package 7, even out the thickness of the material, and make the material flow into the well 10a down to the associated connection lead. After the conductive material 11 has cured, the mask 9 is removed. Then, the lead frame 3 is cut off and the connection leads 6 are bent to form the finished semiconductor package 7, which is shown in FIG. 4.

As shown, the second external face 5c of the finished semiconductor package 7 is covered with a thin layer 11 of the electrically conductive material, and the conducting thin layer also has a lateral extension 11a that is formed against one of the side walls 5a of the package 7. The lateral extension 11a, which is produced because of the well 10a in the mask 9, electrically connects one of the connection leads 6 to the thin layer 11. Thus, the conducting thin layer 11 advantageously screens the semiconductor package 7 so as to improve the electrical performance characteristics of the device. In some embodiments, the connection lead 6 that is electrically connected to the conducting layer 11 is coupled to a predetermined potential.

While in some embodiments of the present invention only one well is provided in the mask, other embodiments use masks having multiple wells to form multiple lateral extensions of the thin layer that are electrically connected to multiple connection leads. Furthermore, in another embodiment of the present invention, the screening of the semiconductor package is further improved by repeating the manufacturing steps described above with reference to FIGS. 2 and 3. More specifically, after performing the steps described above, the semiconductor device is turned over (i.e., upside down) and a second layer of electrically conductive material is deposited on the first external face 5b of the package 7. The second conducting layer also includes at least one lateral extension that is electrically connected to at least one of the connection leads 6.

Likewise, while in some embodiments of the present invention screen printing is used to form the conducting layer, in other embodiments the conducting thin layer 11 and at least one lateral extension 11a are formed by using the mask 9 and spraying an electrically conductive material (e.g., a copper, aluminum, or silver-metallized lacquer). Additionally, in further embodiments, a mask is not used. Instead, a sheet of electrically conductive material (e.g., a 50 micron thick copper foil) is adhesively bonded to at least one of the faces of the package. The conductive sheet has at least one lateral extension that is adhesively bonded to one of the side walls of the package and one of the connection leads.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method of manufacturing a semiconductor package, said method comprising the steps of:

encapsulating an integrated circuit chip and at least part of an external lead frame that is connected to the chip so as to form an encapsulation having a plurality of connection leads projecting from the periphery of the encapsulation;

after completely encapsulating the chip, placing the encapsulation through one end of a through-passage in a mask such that the passage matches at least part of the outline of the encapsulation on one side of the connection leads, at least one side wall of the passage having at least one recess that determines a well that emerges on one side of one of the connection leads; and depositing electrically conductive material on the encapsulation through the other end of the passage in the mask, so that a conducting material layer covers one external face of the encapsulation, the conducting material layer including at least one lateral extension that is formed in the well and that electrically contacts at least the one connection lead.

2. The method as defined in claim 1, wherein in the depositing step, the electrically conductive material is deposited by spraying.

3. The method as defined in claim 1, wherein in the depositing step, the electrically conductive material is deposited by screen printing.

4. The method as defined in claim 1, wherein in the depositing step, the electrically conductive material is deposited by adhesively bonding a metal sheet to the encapsulation.

5. The method as defined in claim 1, wherein the depositing step includes the sub-steps of:

depositing electrically conductive material on one external face of the encapsulation so that a first conducting material layer covers the one external face of the encapsulation and has at least one lateral extension that electrically contacts at least one of the connection leads; and depositing electrically conductive material on another external face of the encapsulation so that a second conducting material layer covers the other external face of the encapsulation and has at least one lateral extension that electrically contacts at least one of the connection leads.

6. The method as defined in claim 1, wherein the conducting material layer has a plurality of lateral extensions that electrically contact at least one of the connection leads.

7. The method as defined in claim 1, wherein the conducting material layer includes one lateral extension that electrically contacts a plurality of the connection leads.

8. The method as defined in claim 1, further comprising the step of forming an operational circuit on a semiconductor substrate to produce the integrated circuit chip.

9. The method as defined in claim 1, further comprising the step of coupling the connection lead that is electrically connected to the conducting material layer to a predetermined potential.

10. The method as defined in claim 1, wherein in the placing step, the passage matches the outline of at least one of the side walls of the encapsulation.

11. The method as defined in claim 1, wherein in the depositing step, the lateral extension is formed so as to extend along one side wall of the encapsulation from the one external face of the encapsulation to the one connection lead.

12. A method of manufacturing a semiconductor package, said method comprising the steps of:

encapsulating an integrated circuit chip and at least part of an external lead frame that is connected to the chip so as to form an encapsulation having a plurality of connection leads projecting from the periphery of the encapsulation;

after completely encapsulating the chip, placing the encapsulation in a through-passage in a mask such that the passage matches at least part of the outline of the encapsulation, at least one side wall of the passage having a vertical groove that determines a well that reaches one of the connection leads; and depositing electrically conductive material on the encapsulation through the passage in the mask so that a conducting material layer covers one external face of the encapsulation, the conducting material layer including a lateral extension that is formed in the vertical groove in the mask and that electrically contacts the one connection lead.

13. The method as defined in claim 12, wherein the depositing step includes the sub-steps of:

depositing electrically conductive material on one external face of the encapsulation so that a first conducting material layer covers the one external face of the encapsulation and has the lateral extension that electrically contacts the one connection lead; and depositing electrically conductive material on another external face of the encapsulation so that a second conducting material layer covers the other external face of the encapsulation and has a lateral extension that electrically contacts at least one of the connection leads.

14. The method as defined in claim 12, wherein in the depositing step, the conducting material layer is formed with a plurality of lateral extensions that electrically contact at least one of the connection leads.

15. The method as defined in claim 12, wherein in the depositing step, the conducting material layer is formed with one lateral extension that electrically contacts a plurality of the connection leads.

16. The method as defined in claim 12, wherein in the placing step, the passage matches the outline of at least one of the side walls of the encapsulation.

17. The method as defined in claim 12, wherein in the depositing step, the lateral extension is formed so as to extend along one side wall of the encapsulation from the one external face of the encapsulation to the one connection lead.

* * * * *